United States Patent [19]

Hayakawa et al.

[11] Patent Number: 6,063,876

[45] Date of Patent: May 16, 2000

[54] EPOXY RESIN COMPOSITION AND EPOXY RESIN COMPOSITION FOR ENCAPSULATING SEMICONDUCTORS

[75] Inventors: Atsuhito Hayakawa; Yasuyuki Murata; Norio Tohriiwa, all of Yokkaichi, Japan

[73] Assignee: Shell Oil Company, Houston, Tex.

[21] Appl. No.: 09/085,209

[22] Filed: May 27, 1998

[30] Foreign Application Priority Data

May 29, 1997 [JP] Japan ................................ 9-176277

[51] Int. Cl.[7] .................................................. C08G 59/20
[52] U.S. Cl. ........................ 525/524; 523/427; 523/466
[58] Field of Search .................................. 523/427, 466; 525/524

[56] References Cited

U.S. PATENT DOCUMENTS

| | | | |
|---|---|---|---|
| 5,312,878 | 5/1994 | Shiobara et al. | 525/507 |
| 5,414,058 | 5/1995 | Ono et al. | 525/523 |
| 5,739,186 | 4/1998 | Hayakawa et al. | 523/443 |

*Primary Examiner*—Margaret G. Moore
*Attorney, Agent, or Firm*—Y. Grace Tsang

[57] ABSTRACT

An epoxy resin composition which can be crushed at an ordinary temperature and which comprises respective components described below, (a) 10 to 80 parts by weight of a 4,4'-biphenol type epoxy resin which is crystalline at an ordinary temperature, (b) 20 to 90 parts by weight of a noncrystalline epoxy resin having a softening point of 35° C. to 55° C.

8 Claims, No Drawings

EPOXY RESIN COMPOSITION AND EPOXY RESIN COMPOSITION FOR ENCAPSULATING SEMICONDUCTORS

FIELD OF THE INVENTION

The present invention relates to an epoxy resin composition which can be crushed at an ordinary temperature, is remarkably low in melt viscosity, and which can provide excellent physical properties after curing. Also, the present invention relates to an epoxy resin composition for encapsulating semiconductors in which the above-mentioned epoxy resin composition is formulated, which is excellent in fluidity, and can provide a cured product having excellent solder crack resistance.

BACKGROUND OF THE INVENTION

Epoxy resins have been employed in a wide field such as adhesion, casting, encapsulating, laminating, molding, coating, etc. Because of the excellent physical properties after curing and ease in handling. Further, epoxy resin includes many kinds, and since physical properties after curing largely vary according to the selection, it has been separately employed according to use fields and purposes.

In recent years, with a progress of severe conditions in uses of polymeric materials, a variety of properties required for the polymeric materials are becoming severer, and requirements in properties have not become able to be sufficiently satisfied in various epoxy resins which are usually employed.

For example, although epoxy resin compositions are employed for encapsulating semiconductors, requirements in properties are getting severer even in the field. That is, semiconductor devices become highly integrated owing to semiconductor chips having a remarkably large capacity, and packages themselves become small-sized and thin-sized. Still further, in the semiconductor devices, mounting also shifts to a surface-mounting, and the semiconductor devices in the surface mounting are directly immersed into a solder bath. Accordingly, those are exposed to a high temperature circumstance, and a large stress is wholly induced in the package because of abrupt expansion by absorbed moisture, and cracks are caused in encapsulants. For that reason, for the epoxy resin composition for encapsulants having excellent solder crack resistance, there are required a high heat resistance (that is, high glass transition temperatures), a low moisture absorption property, and a low stress property.

By mixing a large amount of inorganic fillers such as fused silica powder, there has been widely carried out to improve a low moisture absorption property and a low stress property (that is, a low thermal expansion ratio), and it is largely effective for an improvement of the solder crack resistance. However, since mixing a large amount of inorganic fillers deteriorates fluidity in molding, low melt viscosity has been also required in the epoxy resin composition for encapsulants.

Moreover, high fluidity has been also required in the epoxy resin composition for encapsulating semiconductors with small-sizing and thin-sizing in the package, and lowering in melt viscosity has become more strictly required for the epoxy resin.

Cresol-novolak type epoxy resins which are mainly employed at present time have not become regarded as sufficient in view of a low moisture absorption property and low melt viscosity.

In a process for the preparation of the epoxy resin composition for encapsulating semiconductors, there is usually conducted a process in which respective materials are melt kneaded after crushing and, further crushed while cooling.

Accordingly, raw materials require capability of being respectively crushed. That is, an epoxy resin having a softening point of not more than 55° C. is too soft and sticky to crush at an ordinary temperature. Therefore, it cannot be employed, or there are required specified apparatuses and conditions. In general, an epoxy resin having a low molecular weight has low melt viscosity and, in the case of a usual noncrystalline epoxy resin, a softening point lowers with lowering of a molecular weight, and since it becomes semi-solid state or liquid, it cannot be crushed at an ordinary temperature.

Accordingly, even in an epoxy resin having excellent physical properties as an epoxy resin composition for encapsulating semiconductors such as the cresol-novolak type epoxy resins, lowering in melt viscosity is limited because of incapability of lowering a molecular weight in which a softening point becomes not more than 55° C., resulting in that the solder crack resistance cannot be sufficiently improved. Although it is investigated (Japanese Patent Application Laid-open No. Sho 61-047725, etc.) that there is employed a tetramethylbiphenol type epoxy resin having low melt viscosity because of a low molecular weight, and which can be crushed because of becoming crystalline at an ordinary temperature, solder crack resistance cannot be sufficiently improved because of a poor heat resistance in a cured product therefrom. Further, although a 4,4'-biphenol type epoxy resin (Japanese Patent Application Laid-open No. Hei 1-230619), which also becomes crystalline, is low in melt viscosity and also excellent in heat resistance, it cannot be solely employed because of a high melting point and also poor compatibility with a curing agent, etc. There is a problem that melt viscosity increases in a resin system when mixed with a conventional noncrystalline solid epoxy resin.

SUMMARY OF THE INVENTION

An object of the present invention is to provide an epoxy resin composition that can be crushed at an ordinary temperature, is low in melt viscosity, and can provide excellent physical properties after curing. Also, it is an object of the invention to provide a novel epoxy resin composition for encapsulating semiconductors in which the above-mentioned epoxy resin composition is mixed, and which can provide a cured product having excellent fluidity and solder crack resistance.

As a result of a variety of investigations repeated for solving the above-mentioned problems, the present inventors have found out that, by mixing a 4,4'-biphenol type epoxy resin with a noncrystalline epoxy resin having a low softening point, the mixture can be crushed at an ordinary temperature, and the object can be attained.

The present invention relates to an epoxy resin composition which can be crushed at an ordinary temperature, said epoxy resin composition comprising:

(a) 10 to 80 parts by weight of a 4,4'-biphenol type epoxy resin which is crystalline at an ordinary temperature, (b) 20 to 90 parts by weight of a noncrystalline epoxy resin having a softening point of 35° C. to 55° C.;

DETAILED DESCRIPTION OF THE INVENTION

As used herein, the phrase "ordinary temperature" refers to ambient/room temperature.

The 4,4'-biphenol type epoxy resin (a), which is one component in the epoxy resins employed in the epoxy resin composition of the present invention, is crystalline at an ordinary temperature, whereby it can be crushed, and it is very low in viscosity over the melting point thereof because of a low molecular weight. Further, it is rigid in the structure, whereby, it is excellent also in heat resistance. However, since the melting point is very high such as not less than 150° C., and it is also poor in compatibility with a curing agent, etc., it cannot be employed solely.

In the present invention, an epoxy resin composition was prepared which satisfies all properties required for the use of the noncrystalline epoxy resin having a low melting point which cannot be solely employed because of being incapable of crushing, in addition to the 4,4'-biphenol type epoxy resin in a specified proportion.

The 4,4'-biphenol type epoxy resin (a), which is one component in the epoxy resin composition of the present invention, is an epoxy resin prepared by condensation polymerization of 4,4'-biphenol with epihalohydrin in the presence of alkalis.

The structure is represented by general formula (X), wherein, n is preferably 0 to 0.5, and more preferably 0 to 0.3 on an average in order to maintain crystallinity.

Further, the noncrystalline epoxy resin (b) having a softening point of 35° C. to 55° C., which is another component in the epoxy resin composition, is not particularly limited so far as it is noncrystalline and has a softening point of 35° C. to 55° C. There are exemplified, for example, epoxy resins prepared by various phenols and epihalohydrin, epoxy resins prepared by amines such as diaminodiphenylmethane, aminophenol, xylenediamine and epihalohydrin, and epoxy resins prepared by various carboxylic acids such as methylhexahydroxy phthalic acid and a dimer acid and epihalohydrin. The various phenols include phenols such as bisphenol A, bisphenol F, bisphenol AD, hydroquinone, methylhydroquinone, dibutylhydroquinone, resorcin, methylresorcin, dihydroxy diphenylether, dihydroxynaphthalene, phenol novolak resin, cresol novolak resin, bisphenol A novolak resin, phenol aralkyl resin, terpenphenol resin, dicyclopentadienephenol resin, naphthol novolak resin, brominated bisphenol A, brominated phenol novolak resin, and phenol-based compounds such as polyvalent phenol resins which are obtained by condensation reaction of the various phenols with various aldehydes such as benzaldehyde, hydroxy benzaldehyde, croton aldehyde, and glyoxal.

The various epoxy resins may be employed solely or in combinations of two or more kinds. In the case of employing in combinations of two or more kinds, the respective epoxy resins do not always require noncrystallinity and a softening point of 35° C. to 55° C. If a mixed resin shows noncrystallinity and a softening point of 35° C. to 55° C., it can be employed as the noncrystalline epoxy resin (b) having a softening point of 35° C. to 55° C. which is one component in the epoxy resin composition of the present invention.

Of the noncrystalline epoxy resins (b), there is preferred a noncrystalline epoxy resin having a softening point of 35° C. to 55° C. composed of at least one kind of epoxy resin obtained by reaction of epihalohydrin with at least one kind of phenol compound selected from the group consisting of bisphenol A, bisphenol F, phenol-novolak resin, cresol-novolak resin, phenol-aralkyl resin, terpenephenol resin, dicyclopentadiene phenol resin, phenolcyclohexanone resin, and phenol benzaldehyde resin, and phenol compound represented by the general formulae (I) to (IV), in view of properties after curing, etc.

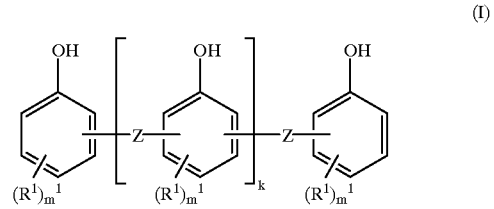

(I)

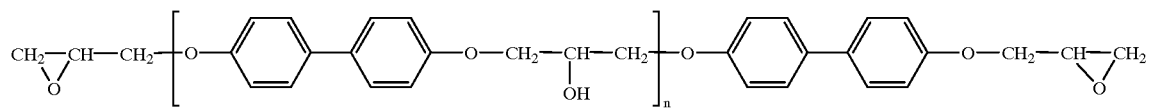

(X)

In formula (I), the $R^1$s may be identical or different, each denoting an alkyl group having a carbon number of 1 to 10, a substituted or unsubstituted phenyl group, a substituted or unsubstituted aralkyl group, an alkoxy group, or a halogen atom. k is from 0 to 8 on an average, and the $m^1$s may be identical or different, each denoting an integer of from 0 to 3. The Zs may be identical or different, each denoting a divalent group represented by general formulae (V) to (IX) described below.

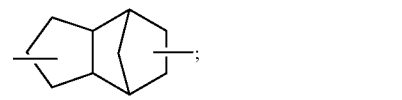

(V)

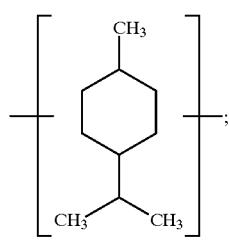

(VI)

-continued

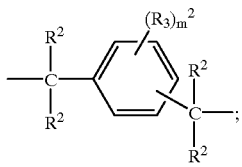
(VII)

wherein, each $R^2$ and $R^3$ may be identical or different, each denoting a hydrogen atom, an alkyl group having a carbon number of 1 to 5, a substituted or unsubstituted phenyl group, a substituted or unsubstituted aralkyl group, an alkoxy group, or a halogen atom, and $m^2$ is an integer from 0 to 4;

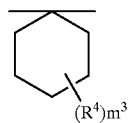
(VIII)

wherein, each $R^4$ may be identical or different, each denoting an alkyl group having a carbon number of 1 to 5, a substituted or unsubstituted phenyl group, a substituted or unsubstituted aralkyl group, an alkoxy group, or a halogen atom, and $m^3$ is an integer from 0 to 6;

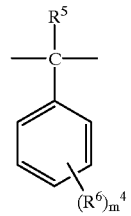
(IX)

wherein, each $R^5$ and $R^6$ may be identical or different, each denoting a hydrogen atom, an alkyl group having a carbon number of 1 to 5, a substituted or unsubstituted phenyl group, a substituted or unsubstituted aralkyl group, an alkoxy group, or a halogen atom, and $m^4$ is an integer from 0 to 4;

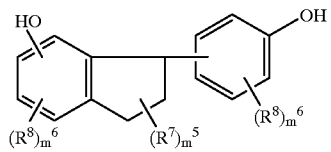
(II)

wherein, each $R^7$ and $R^8$ may be identical or different, each denoting an alkyl group having a carbon number of 1 to 5, a substituted or unsubstituted phenyl group, a substituted or unsubstituted aralkyl group, an alkoxy group, or a halogen atom, and each $m^5$ and $m^6$ may be identical or different, each denoting an integer from 0 to 4;

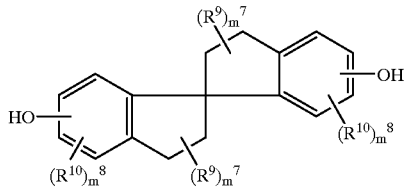
(III)

wherein, each $R^9$ and $R^{10}$ may be identical or different from each other, and is an alkyl group having a carbon number of 1 to 5, a substituted or unsubstituted phenyl group, a substituted or unsubstituted aralkyl group, an alkoxy group, or a halogen atom, and each $m^7$ and $m^8$ may be identical or different from each other, and is an integer from 0 to 4;

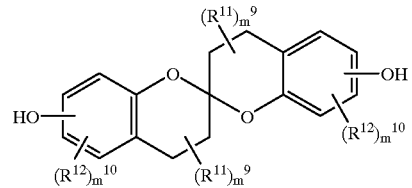
(IV)

wherein, each $R^{11}$ and $R^{12}$ may be identical or different from each other, and is an alkyl group having a carbon number of 1 to 5, a substituted or unsubstituted phenyl group, a substituted or unsubstituted aralkyl group, an alkoxy group, or a halogen atom, and each $m^9$ and $m^{10}$ may be identical or different from each other, and is an integer of from 0 to 4.

It is to be noted that a measurement of a softening point was conducted by a ring and ball method (JIS K7234) in the present invention. Further, crushing was conducted with a usual crusher such as a hammer mill, a ball mill, feather mill, a pulverizer, a jet mill, etc., so that average particle size was adjusted to $10\mu$ to $500\mu$ or so.

The reaction of the phenol compounds with the epihalohydrin can be carried out by publicly known methods, and examples in typical embodiments are described below in detail. Firstly, the phenol compounds are dissolved into 3 to 20 mol of the epihalohydrin based on 1 mol of a phenolic hydroxyl group in the phenol compounds to prepare a uniform solution. Subsequently, while agitating the solution, the reaction is carried out by addition of 0.9 to 2 mol of an alkaline metal hydroxide based on 1 mol of phenolic hydroxyl group in the form of solid or aqueous solution. The reaction can be carried out under an ordinary pressure or a reduced pressure, and the reaction temperature is usually approximately 30° C. to 105° C. in the case of a reaction under an ordinary pressure, and it is approximately 30° C. to 80° C. in the case of a reaction under a reduced pressure. In the reaction, a reaction liquid is optionally azeotropically evaporated while maintaining a fixed temperature, and a condensate obtained by cooling evaporated vapor is separated into oil/water, and then water is removed from a reaction system by a method in which an oily component removed from a water component is circulated into the reaction system. The alkaline metal hydroxide is intermittently or continuously supplied over 1 to 8 hours in order to suppress an abrupt reaction. Total reaction period is usually 1 to 10 hours.

After the completion of the reaction, insoluble salts by-produced are removed by filtration or water washing, followed by distilling out for removing unreacted epihalohydrin under a reduced pressure to obtain an aimed epoxy resin.

As the epihalohydrin in the reaction, epichlorohydrin or epibromohydrin is usually employed, and as the alkaline metal hydroxide, NaOH or KOH is usually employed.

Further, in the reaction, there may be also employed a catalyst which includes quaternary ammonium salts such as tetraethylammonium chloride and tetraethyl ammonium bromide, tertiary amines such as benzylmethyl amine and 2,4,6-(trisdimethylaminomethyl)phenol, imidazoles such as 2-ethyl-4-methylimidazole and 2-phenylimidazole, and phosphonium salts such as ethyltriphenyl phosphoniumiodide, and phosphines such as triphenyl phosphine.

Still further, in the reaction, there may be also employed an inert organic solvent which includes alcohols such as ethanol and isopropanol, ketones such as acetone and methylethylketone, ethers such as dioxane and ethyleneglycol dimethylether, glycol ethers such as ethyleneglycol monomethylether, ethyleneglycol monobutylether, and propyleneglycol monomethylether, dimethyl sulfoxide, and dimethylformamide, which are an aprotic polar solvent.

In addition, in the case that the epoxy resin obtained as described hereinabove contains a too large amount of saponifiable halogens, there can be obtained a refined epoxy resin having a sufficiently small amount of saponifiable halogens by repeated treatments. That is, a crude epoxy resin is dissolved again into an inert organic solvent such as isopropanol, methylethyl ketone, methylisobutyl ketone, toluene, xylene, dioxane, propyleneglycol monomethylether, dimethylsulfoxide, etc., and a ring-closing reaction is carried out again at a temperature of approximately 30° C. to 120° C. for 0.5 to 8 hours after adding an alkaline metal hydroxide in the form of solid or aqueous solution, followed by removing an excessive amount of the alkaline metal hydroxide and by-produced salts by a method such as water washing, and removing the organic solvent by distilling out at a reduced pressure to obtain a refined epoxy resin.

In the epoxy resin composition of the present invention, the 4,4'-biphenol type epoxy resin (a) and the noncrystalline epoxy resin (b) may be employed by mixing after separately preparing or obtaining, and those may be employed as a mixture of respective epoxy resins which are prepared by allowing to simultaneously react a mixture composed of the 4,4'-biphenol and the phenol resin which are respective raw materials of the noncrystalline epoxy resin with the epihalohydrin. In order to obtain an epoxy resin having excellent compatibility with a curing agent, etc., the latter method is more preferred.

In the case that the former method is employed, it is preferred to cool the mixture to an ordinary temperature after completely mixed at a melting state by heating, and to crush.

In the case that the latter method is employed, since it is impossible to measure softening points in the respective components after epoxidation, there must be perceived a structure and a molecular weight of the starting phenol compound, and conditions in epoxidation by solely epoxidizing in advance so that a softening point of the noncrystalline epoxy resin (b) in the epoxy resin composition is adjusted to a desired temperature.

Further, it is required that the use proportion of the respective raw materials is controlled in advance so that the proportion of the mixture of the 4,4'-biphenol type epoxy resin (a) and the noncrystalline epoxy resin (b) is adjusted to a fixed proportion, or it is required to be adjusted by adding either epoxy resin after epoxidation to adjust to a fixed proportion.

The 4,4'-biphenol type epoxy resin (a) is mixed with the noncrystalline epoxy resin (b) in a proportion of 20 to 90 parts by weight of the noncrystalline epoxy resin (b) based on 10 to 80 parts by weight of the 4,4'-biphenol type epoxy resin (a), and preferably 40 to 85 parts by weight of the noncrystalline epoxy resin (b) based on 15 to 60 parts by weight of the 4,4'-biphenol type epoxy resin (a). In the case that the 4,4'-biphenol type epoxy resin (a) is not more than 10 parts by weight, though the resin mixture is excellent in compatibility and physical properties in curing, it is poor in a property in crushing. In the case of not less than 80 parts by weight, though the resin mixture is excellent in fluidity, there is caused a problem that it is poor in compatibility. In the case that the noncrystalline epoxy resin (b) is not more than 20 parts by weight, though the resin mixture is excellent in fluidity, it is poor in compatibility and, in the case of not less than 90 parts by weight, though the resin mixture is excellent in compatibility and a physical property in curing, there is caused a problem that it is poor in a property in crushing.

The epoxy resin composition of the present invention can be crushed at an ordinary temperature, and it is remarkably low in melt viscosity, and which can provide an excellent property after curing. Accordingly, it can be advantageously employed in a field such as a molding material for encapsulating semiconductors, powder coatings, and powdered insulation materials.

Further, the epoxy resin composition for encapsulating semiconductors of the present invention is an epoxy resin composition for encapsulating semiconductors which comprises the epoxy resin composition of the present invention with an inorganic filler and a curing accelerator as essential components, and there can be mixed and employed other epoxy resins except the 4,4'-biphenol type epoxy resin (a) and the noncrystalline epoxy resin (b).

As the other epoxy resin to be employed, there are exemplified, for example, an epoxy resin which is crystalline at an ordinary temperature prepared by epihalohydrin and a phenol compound such as 3,3'5,5'-tetramethyl-4-4'-biphenol, 4,4'-dihydroxy diphenylmethane, 3,3'5,5'-tetramethyl-4-4'dihydroxy diphenyl methane, hydroquinone, dibutylhydroquinone, and dihydroxydiphenyl ether, and a noncrystalline solid epoxy resin having a softening point exceeding 55° C. prepared by epihalohydrin and various phenol compounds which include bisphenol A, bisphenol F, bisphenol AD, hydroquinone, methylhydroquinone, dibutylhydroquinone, resorcin, methylresorcin, dihydroxydiphenylether, dihydroxynaphthalene, phenol-novolak resin, cresol-novolak resin, bisphenol A novolak resin, phenolaralkyl resin, terpene phenol resin, dicyclopentadiene phenol resin, phenolcyclohexanone resin, phenolbenzaldehyde resin, naphthol novolak resin, brominated bisphenol A, brominated phenol novolak resin, etc., and various phenol compounds such as a polyvalent phenol resin obtained by condensation reaction of various phenol compounds with various aldehydes such as hydroxybenzaldehyde, croton aldehyde, and glyoxal.

The other epoxy resins are employed in a proportion of preferably not more than 100 parts by weight, and more preferably not more than 50 parts by weight based on 100 parts by weight of the total amount of the 4,4'-biphenol type epoxy resin (a) and the noncrystalline epoxy resin (b). In the case that the other epoxy resins are employed in a proportion of not less than 100 parts by weight, an effect in the present invention is not sufficiently shown.

Next, in the epoxy resin composition for encapsulating semiconductors of the present invention, a curing agent for epoxy resins are formulated as an essential component, and as the curing agent for epoxy resins, usual curing agents for epoxy resins can be employed without being particularly limited.

As the curing agent for epoxy resins to be employed, there are exemplified, for example, various phenols such as bisphenol A, bisphenol F, bisphenol AD, hydroquinone, resorcin, methyllesorcin, biphenol, tetramethylbiphenol, dihydroxy naphthalene, dihydroxy diphenylether, phenol novolak resin, cresol novolak resin, bisphenol A novolak resin, dicyclopentadiene phenol resin, terpene phenol resin, phenol aralkyl resin, naphthol novolak resin, brominated bisphenol A, and brominated phenol novolak resin, various phenol resins such as a polyvalent phenol resin which is obtained by condensation reaction of various phenols with various aldehydes such as hydroxybenzaldehyde, croton aldehyde, and glyoxal, active ester compounds obtained by esterification in which phenolic hydroxyl groups in the various phenols (resins) are completely or partially replaced with a benzoate or an acetate, etc., acid anhydrides such as methyltetrahydrophthalic anhydride, hexahydrophthalic anhydride, pyromeritic anhydride, and methylnadic anhydride, diethylene triamine, isophoronediamine, diaminodiphenylmethane, diaminodiphenylsulphone, and dicyandiamide, etc.

Of the various curing agents for epoxy resins, there are preferred the phenol aralkyl resin, the terpene phenol resin, the dicyclopentadiene phenol resin, and active ester-modified phenol resins obtained by complete or partial esterification of the phenolic hydroxyl groups in the various phenol resins in view of physical properties after curing, etc.

The amount of the curing agent for epoxy resins to be employed in the epoxy resin composition for encapsulating semiconductors of the present invention is preferably 0.5 to 2.0 mol, more preferably 0.7 to 1.2 mol as the total groups capable of reacting with epoxy groups in the total curing agent for epoxy resins based on 1 mol of epoxy groups in the total components of the epoxy resins.

Next, in the epoxy resin composition for encapsulating semiconductors of the present invention, an inorganic filler is formulated. As the kind of the inorganic filler, there are exemplified, for example, fused silica, crystalline silica, glass powder, alumina, and calcium carbonate, etc. The shape thereof is a crushed type or spherical. The various inorganic fillers are employed solely or as a mixture of at least two kinds and, of those, the fused silica and the crystalline silica are more preferred. The use amount is 70 to 95% by weight, preferably 80 to 93% by weight, and more preferably 85 to 92% by weight based on the total weight of the composition. In the case of not more than 70% by weight, a low stress property becomes insufficient, and in the case of not less than 95% by weight, fluidity decreases, resulting in that molding becomes difficult. Further, as the shape, it is preferred to contain not less than 30% by weight of spherical components for maintaining fluidity.

In addition, the curing accelerator to be employed in the epoxy resin composition for encapsulating semiconductors of the present invention is a compound which is capable of accelerating reaction of epoxy groups in the epoxy resin with active groups in the curing agent. As the curing accelerator, there are exemplified, for example, phosphine compounds such as tributyl phosphine, triphenyl phosphine, tris(dimethoxyphenyl)phosphine, tris(hydroxypropyl) phosphine, tris(cyanoethyl)phosphine, phosphonium salts such as tetraphenylphosphonium phenyl borate, methyltributylphosphonium tetraphenylborate, methyltricyanoethylphosphonium tetraphenylborate, imidazoles such as 2-methylimidazole, 2-phenylimidazole, 2-ethyl-4-methylimidazole, 2-undecylimidazole, 1-cyanoethyl-2-methylimidazole, 2,4-dicyano-6-[2-methylimidazolyl-(1)]-ethyl-S-triazine, 2,4-dicyano-6-[2-undecylimidazolyl-(1)]-ethyl-S-triazine, imidazolium salts such as 1-cyanoethyl-2-undecylimidazolium trimeritate, 2-methylimidazolium isocyanurate, 2-ethyl-4-methylimidazolium tetraphenylborate, 2-ethyl-1,4-dimethylimidazolium tetraphenylborate, amines such as 2,4,6-tris (dimethylaminomethyl)phenol, benzylmethylamine, tetramethyl butylguanidine, N-methylpiperazine, 2-dimethylamino-1-pyroline, ammonium salts such as triethylammonium tetraphenyl borate, diazabicyclo compounds such as 1,5-diazabicyclo(5,4,0)-7-undecene, 1,5-diazabicyclo(4,3,0)-5-nonene, 1,4-diazabicyclo(2,2,2) octane, and tetraphenylborates of the diazabicyclo compounds, phenol salts thereof, phenol novolak salts thereof, and 2-ethylhexanoic acid salts thereof.

Of the compounds which are employed as the curing accelerator, there are preferred the phosphine compounds, imidazole compounds, diazabicyclo compounds, and the salts thereof.

The curing accelerator is employed solely or as a mixture of two or more kinds, and the amount is 0.1 to 7% by weight, more preferably 1 to 5% by weight based on the epoxy resins.

In the epoxy resin composition for encapsulating semiconductors of the present invention, there can be optionally formulated coupling agents, plasticizers, and pigments.

Further, as a promotor for flame retardancy, antimony trioxide, phosphoric acid, etc. can be properly formulated.

The epoxy resin composition for encapsulating semiconductors of the present invention is excellent in fluidity, and further, since it can provide a cured product having excellent solder crack resistance, it can be advantageously employed in a field of encapsulating semiconductors.

EXAMPLES

Hereinafter, the present invention is illustrated in more detail based on Preparation Examples for respective epoxy resins employed in the epoxy resin composition of the present invention, Examples for the epoxy resin composition of the present invention, Crushing Examples and Comparative Examples for the respective epoxy resins and the respective epoxy resin compositions and, further, Examples and Comparative Examples for the epoxy resin composition for encapsulating of the present invention semiconductors of the present invention. The examples of the present invention are included for illustrative purposes only and are in no way intended to limit the present invention.

Preparation Examples 1 to 7 for Respective Epoxy Resins

A three-necked flask having internal capacity of 3-liter equipped with a thermometer, an agitator, and a condenser was charged with the phenol compounds of the kind and the amount shown in Table 1, 1300 g of epichlorohydrin, and 500 g of methoxypropanol. After dissolved uniformly by elevating a temperature to 50° C., 190 g of aqueous solution containing 48.5% by weight of sodium hydroxide was added dropwise over 1 hour. The temperature was gradually elevated during adding dropwise, so that the inside of the system attains to 70° C. at the period of the completion of dropwise addition. After that, reaction was carried out while maintaining the temperature at 70° C. for 30 minutes. After the completion of the reaction, by-produced salts and excessive sodium hydroxide were removed by washing with water. Subsequently, excessive epichlorohydrin and methoxypropanol were distilled out from a product at a reduced pressure to obtain a crude epoxy resin. The crude epoxy resin was dissolved into 700 g of methylisobutyl ketone, followed by adding 6 g of aqueous solution containing 48.5% by weight of sodium hydroxide to allow to react at the temperature of 80° C. for 1 hour. After the completion of the reaction, sodium primary phosphoric acid was added to neutralize excessive sodium hydroxide, and then salts by-produced were removed by washing with water. Subsequently, methylisobutyl ketone was completely removed at a reduced pressure to obtain aimed Epoxy resins.

Properties, melting points or softening points, epoxy equivalent, and melt viscosity in the Epoxy resins are shown in Table 1.

Examples 1 to 3 for Epoxy Resin Compositions and Comparative Examples 1 and 2

A three-necked flask having internal capacity of 500-ml equipped with a thermometer, an agitator, and a condenser was charged with the respective epoxy resins prepared in the above-mentioned Preparation Examples 1 to 3 and 5, a cresol novolak type noncrystalline epoxy resin having a softening point of 67° C. which is commercially supplied or a tetramethylbiphenol type crystalline epoxy resin which is commercially supplied, in an amount shown in Table 2, followed by uniformly melting by elevating a temperature to 150° C. Respective molten mixtures were taken out in a vessel, followed by cooling to a room temperature.

Properties, softening points, epoxy equivalent, and melt viscosity in the Epoxy resin compositions are shown in Table 2.

TABLE 1

| | Preparation Example | | | | | | |
|---|---|---|---|---|---|---|---|
| | 1 | 2 | 3 | 4 | 5 | 6 | 7 |
| Amount (g) of a phenol compound | | | | | | | |
| 4,4'-biphenol | 188 | | | | | | |
| Cresol novolak resin A *1 | | 240 | | | | | |
| Cresol novolak resin B *2 | | | 170 | | | | |
| Cyclopentadienephenol resin *3 | | | | 340 | | | |
| Terpenephenol resin *4 | | | | | 330 | | |
| Phenolaralkyl resin *5 | | | | | | 340 | |
| 6,6'-dihydroxy-3,3,3',3'-tetramethyl-1,1'-spirobiindane | | | | | | | 308 |
| Bisphenol A | | | | 68 | | | |
| Analytical result of Epoxy resins | | | | | | | |
| Properties (room temperature) | Crystalline | Non-Crystalline | Non-Crystalline | Non-Crystalline | Non-Crystalline | Non-Crystalline | Non-Crystalline |
| Melting point (° C.) *6 | 161 | — | — | — | — | — | — |
| Softening point (° C.) *7 | — | 52 | 51 | 53 | 44 | 42 | 50 |
| Epoxy equivalent | 162 | 205 | 198 | 242 | 233 | 244 | 221 |
| Melt viscosity (PS) at 150° C. | 0.1 | 0.7 | 0.6 | 0.5 | 0.3 | 0.4 | 0.4 |
| Crushing results | | | | | | | |
| Roughly crushing | Possible | Possible | Possible | Possible | Impossible | Impossible | Possible |
| Finely crushing | Possible | Impossible | Impossible | Impossible | Impossible | Impossible | Impossible |

Note
*1: a softening point of 75° C., manufactured by Asahi Yukizai, Ltd.
*2: a softening point of 98° C., manufactured by Asahi Yukizai, Ltd.
*3: DPR-1000 having a softening point of 87° C., manufactured by Mitsui Toatsu Chemicals, INC.
*4: YP-90 having a softening point of 80° C., manufactured by Yasuhara Chemical, Ltd.
*5: XL225-3L having a softening point of 71° C., manufactured by Mitsui Toatsu Chemicals, INC.
*6: a microscopic method
*7: a ball and ring method

TABLE 2

|  | Example | | | Comparative Example | |
| --- | --- | --- | --- | --- | --- |
|  | 1 | 2 | 3 | 1 | 2 |
| Amount (g) of an epoxy resin | | | | | |
| Epoxy resin in Preparation Example 1 | 100 | 40 | 100 | 100 | |
| Epoxy resin in Preparation Example 2 | 100 | | | | 100 |
| Epoxy resin in Preparation Example 3 | | 160 | | | |
| Epoxy resin in Preparation Example 5 | | | 100 | | |
| Cresol novolak type epoxy resin *1 | | | | 100 | |
| Tetramethylbiphenol type epoxy resin *2 | | | | | 100 |
| Analytical result of Epoxy resin Compositions | *4 | *4 | *4 | *4 | Non-Crystalline |
| Properties (room temperature) | | | | | |
| Softening point (° C.) *3 | *5 | *5 | *5 | *5 | 46 |
| Epoxy equivalent | 181 | 190 | 191 | 184 | 196 |
| Melt viscosity (PS) at 150 C | 0.3 | 0.2 | 0.2 | 0.7 | 0.4 |
| Crushing results | | | | | |
| Roughly crushing | Possible | Possible | Possible | Possible | Impossible |
| Finely crushing | Possible | Possible | Possible | Possible | Impossible |

Note
*1: Epikote 180S65 having a softening point of 67° C. and epoxy equivalent of 212 manufactured by Yuka Shell Epoxy, K.K.
*2: Epikote YX4000 having a melting point of 107° C. and epoxy equivalent of 187 manufactured by Yuka Shell Epoxy, K.K.
*3: a ball and ring method
*4: a mixed state by crystalline and noncrystalline portions
*5: incapable of measuring because of a mixed state by crystalline portions Examples 4 to 8 for Epoxy Resin Compositions The same epoxidation reactions were followed as in the above-mentioned respective Preparation Examples except that there were employed the phenol compounds of the kind and the amount as shown in Table 3 to obtain aimed Epoxy resin compositions.

Properties in the Epoxy resin compositions all show a mixed state by crystalline and noncrystalline portions, and epoxy equivalent and melt viscosity are shown in Table 3.

TABLE 3

|  | Example | | | | |
| --- | --- | --- | --- | --- | --- |
|  | 4 | 5 | 6 | 7 | 8 |
| Amount (g) of a phenol compound | | | | | |
| 4,4'-biphenol | 83 | 94 | 73 | 130 | 71 |
| Cresol novolak resin *1 | 135 | | | | |
| Cyclopentadienephenol resin *2 | | 170 | | | |
| Terpenephenol resin *3 | | | 202 | | |
| Phenolaralkyl resin *4 | | | | 104 | |
| 6,6'-dihydroxy-3,3,3',3'-tetramethyl-1,1'-spirobiindane | | | | | 192 |
| Composition of epoxy resin compositions (% by weight) | | | | | |
| (a) 4,4'-biphenol type epoxy resin | 40 | 40 | 30 | 60 | 30 |
| (b) noncrystalline epoxy resin | 60 | 60 | 70 | 40 | 70 |
| Analytical result of Epoxy resin compositions | | | | | |
| Epoxy equivalent | 187 | 203 | 207 | 188 | 202 |
| Melt viscosity (PS) at 150° C. | 0.3 | 0.3 | 0.2 | 0.2 | 0.3 |
| Crushing results | | | | | |
| Roughly crushing | Possible | Possible | Possible | Possible | Possible |
| Finely crushing | Possible | Possible | Possible | Possible | Possible |

Note
*1: a softening point of 75° C., manufactured by Asahi Yukizai, Ltd.
*2: DPR-1000 having a softening point of 87° C. manufactured by Mitsui Toatsu Chemicals, INC.
*3: YP-90 having a softening point of 80° C. manufactured by Yasuhara Chemical. Ltd.
*4: XL225-3L having a softening point of 71° C. manufactured by Mitsui Toatsu Chemicals, INC.

Crushing Examples for the Respective Epoxy Resins and Epoxy Resin Compositions The respective Epoxy resins prepared in the above-mentioned Preparation Examples 1 to 7 and the respective Epoxy resin compositions prepared in the above-mentioned Preparation Examples 1 to 8 and Comparative Examples 1 and 2 for the respective Epoxy resin compositions were roughly crushed into masses not more than approximately 1 cm-cube by hands in a room at 23° C., followed by being finely crushed with a hammer mill.

Although the respective Epoxy resins and Epoxy resin compositions in the Preparation Example 1, Examples 1 to 8, and Comparative Example 1 were able to be finely crushed into average particle diameter of approximately 100, the respective Epoxy resins and Epoxy resin compositions in the Preparation Examples 2 to 7, and Comparative Example 2 were not able to be roughly crushed, or not able to be finely crushed even though there were capable of being roughly crushed and capable of being supplied into a crusher, because of sintering inside of the crusher.

Results in crushing relating to the Epoxy resins or Epoxy resin compositions employed in the respective Examples are shown in Tables 1 to 3.

Examples 10 to 17 for Epoxy Resin Compositions for Encapsulating Semiconductors and Comparative Examples 10 to 13

As shown in Table 4, there were mixed the respective Epoxy resins and Epoxy resin compositions which were able to be finely crushed in the above-mentioned crushing tests, a commercially supplied cresol novolak type epoxy resin having a softening point of 67° C. or a commercially supplied tetramethylbiphenol type crystalline epoxy resin and a brominated bisphenol A type epoxy resin as an epoxy resin; phenol novolak resin, phenolaralkyl resin, or terpene phenol resin as a curing agent for epoxy resins; spherical fused silica powder as an inorganic filler; triphenylphosphine as a curing accelerator; and further, antimony trioxide as a promotor for flame retardancy; an epoxy silane as a surface-treating agent for the filler; and carnauba wax as a mold releasing agent, to prepare respective Epoxy resin compositions. The spherical fused silica powder was employed in an amount of 87% by weight based on the total amount of the compositions in the Examples 10 to 16 and Comparative Examples 11 to 13, and in an amount of 83% by weight based on the total amount of the compositions in the Comparative Example 10.

Other components except the epoxy silane were finely crushed into the average particle diameter of approximately 100, and the epoxy silane was coated on the silica powder, followed by being uniformly dryblended. Subsequently, respective compositions were melt kneaded at a temperature of 70° C. to 130° C. for 5 minutes with a mixing roll. The composition in the Comparative Example 12 was not able to be uniformly kneaded because of a too high melting point and incapability of compatibilizing with the curing agent.

Respective melt mixtures were taken out in the form of sheets, and crushed to obtain respective molding materials after cooling to ordinary temperatures.

The respective molding materials except Comparative Example 12 were molded at a mold temperature of 180° C. and a molding time of 180 seconds with a low pressure transfer molding machine to prepare respective test pieces, followed by post curing at 180° C. for 8 hours. Further, Spiral Flow was measured in the respective molding materials.

Table 4 shows the results of Spiral Flow in the respective molding materials, solder crack resistance, moisture absorption ratio, and glass transition temperatures after post curing of the test pieces. The respective molding materials in the Examples 10 to 17 are more excellent in a balance between fluidity (that is, a high Spiral Flow) and solder crack resistance compared to the molding materials in the Comparative Examples 10 to 13.

TABLE 4

| | Example | | | | | | | | Comparative Example | | | |
|---|---|---|---|---|---|---|---|---|---|---|---|---|
| | 10 | 11 | 12 | 13 | 14 | 15 | 16 | 17 | 10 | 11 | 12 | 13 |
| Formulation of Epoxy resin compositions (parts by weight) Epoxy resin | | | | | | | | | | | | |
| Epoxy resin (composition) | Ex. 1 | Ex. 2 | Ex. 3 | Ex. 4 | Ex. 5 | Ex. 6 | Ex. 7 | Ex. 8 | *1 | *2 | Prod. Ex. 1 | Comp. Ex. 1 |
| Amount | 100 | 100 | 100 | 100 | 100 | 100 | 100 | 100 | 100 | 100 | 100 | 100 |
| Brominated epoxy resin *3 | 10 | 10 | 10 | 10 | 10 | 10 | 10 | 10 | 10 | 10 | 10 | 10 |
| Curing agent for an epoxy resin | A*4 | A*4 | B*5 | B*5 | B*5 | C*6 | A*4 | C*6 | A*4 | B*5 | C*6 | A*4 |
| Amount | 60 | 57 | 93 | 95 | 88 | 89 | 58 | 91 | 51 | 95 | 112 | 59 |
| Inorganic filler *7 | 1220 | 1200 | 1450 | 1460 | 1410 | 1420 | 1210 | 1430 | 850 | 1460 | 1570 | 1220 |
| Triphenylphosphine | 1 | 1 | 1 | 1 | 1 | 1 | 1 | 1 | 1 | 1 | 1 | 1 |
| Antimony trioxide | 10 | 10 | 10 | 10 | 10 | 10 | 10 | 10 | 10 | 10 | 10 | 10 |
| Carnauba wax | 1 | 1 | 1 | 1 | 1 | 1 | 1 | 1 | 1 | 1 | 1 | 1 |
| Epoxy silane *8 | 1 | 1 | 1 | 1 | 1 | 1 | 1 | 1 | 1 | 1 | 1 | 1 |
| Fluidity, Spiral Flow (cm) | 80 | 82 | 87 | 85 | 86 | 81 | 81 | 80 | 60 | 83 | *9 | 67 |
| Physical properties after curing | | | | | | | | | | | | |
| Solder crack resistance *10 | 0/16 | 0/16 | 0/16 | 0/16 | 0/16 | 0/16 | 0/16 | 0/16 | 16/16 | 8/16 | *9 | 4/16 |
| Moisture absorption property (%) *11 | 0.21 | 0.21 | 0.17 | 0.18 | 0.16 | 0.17 | 0.21 | 0.17 | 0.36 | 0.20 | *9 | 0.23 |
| Glass transition temperature ° C. *12 | 151 | 152 | 148 | 147 | 148 | 156 | 141 | 152 | 155 | 117 | *9 | 153 |

Note
*1: orthocresol novolak type epoxy resin (Epikote 180S65 having epoxy equivalent of 212, a trade name by Yuka Shell Epoxy, K.K.)

TABLE 4-continued

| | Example | | | | | | | | Comparative Example | | | |
|---|---|---|---|---|---|---|---|---|---|---|---|---|
| | 10 | 11 | 12 | 13 | 14 | 15 | 16 | 17 | 10 | 11 | 12 | 13 |

*2: tetramethylbiphenol type epoxy resin (Epikote YX4000 having epoxy equivalent of 187, a trade name by Yuka Shell Epoxy, K.K.)
*3: brominated bisphenol A type epoxy resin (Epikote 5050 having epoxy equivalent of 385 and bromine content of 49%, a trade name by Yuka Shell Epoxy, K.K.)
*4: A; phenol novolak resin (hydroxyl group equivalent of 103, a softening point of 85° C., manufactured by Gun-Ei Kagaku, Ltd.)
*5: B; phenol aralkyl resin (XL225-3L having a hydroxyl group equivalent of 170 and a softening point of 71° C., a trade name by Mitsui Toatsu Chemicals, INC.)
*6: C; terpene phenol resin (Epikure MP402 having hydroxyl group equivalent of 175 and a softening point of 125° C., a trade name by Yuka Shell Epoxy, K.K.)
*7: spherical fused silica powder (ELSIL BF100, a trade name by Nippon Aerozil, Ltd.)
*8: epoxy silane (KBM-403, a trade name by Shin-Etsu Chemical Co., Ltd.)
*9: Incapable of measuring because a molding material was not obtained.
*10: There was counted the number of cracked 16 pieces of 44-pin- FPP in caused by immersing into a solder bath at 260° C. for 10 seconds after absorbing moisture at 85° C. and 85% RH for 300 hours.
*11: moisture absorption ratio after 300 hours at 85° C. and 55% RH.
*12: measured from a critical point in a thermal expansion curve with a TMA.

The epoxy resin composition of the present invention can be crushed at an ordinary temperature, and it is remarkably low in melt viscosity. Further, since the epoxy resin composition for encapsulating semiconductors of the present invention is excellent in fluidity and can provide a cured product having excellent solder crack resistance, it can be advantageously employed in a use of encapsulating semiconductors.

What is claimed:

1. An epoxy resin composition which can be crushed at an ordinary temperature, said epoxy resin composition comprising:
   (a) 10 to 80 parts by weight of an epoxy resin prepared by condensation polymerization of 4,4"-biphenol with epihalohydrin which epoxy resin is crystalline at an ordinary temperature; and
   (b) 20 to 90 parts by weight of a noncrystalline epoxy resin having a softening point of 35° C. to 55° C.

2. The epoxy resin composition of claim 1, wherein said noncrystalline epoxy resin (b) is a noncrystalline epoxy resin having a softening point of 35° C. to 55° C. composed of at least one kind of epoxy resin obtained by reaction of epihalohydrin with at least one kind of polyvalent phenol compound selected from the group consisting of bisphenol A, bisphenol F, phenol-novolak resin, cresol-novolak resin, phenol-aralkyl resin, terpenephenol resin, dicyclopentadienephenol resin, phenolcyclohexanone resin, and phenol-benzaldehyde resin.

3. The epoxy resin composition of claim 1, wherein said noncrystalline epoxy resin (b) is a noncrystalline epoxy resin having a softening point of 35° C. to 55° C. composed of at least one kind of epoxy resin obtained by reaction of epihalohydrin with at least one kind of phenol compound represented one of the by Formulas (I) to (IV),

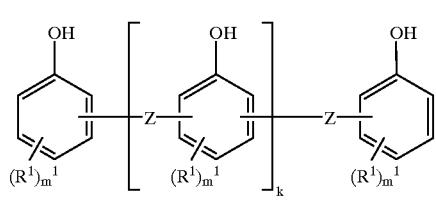
(I)

wherein the $R^1$s may be identical or different, each denoting an alkyl group having a carbon number of 1 to 10, a phenyl group, a aralkyl group, an alkoxy group, or a halogen atom; k is from 0 to 8 on an average; the $m^1$s may be identical or different, each denoting an integer from 0 to 3; and the Zs may be identical or different, each denoting a divalent group represented by formulae (V) to (IX),

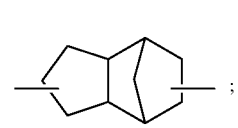
(V)

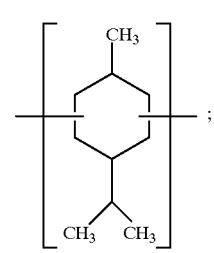
(VI)

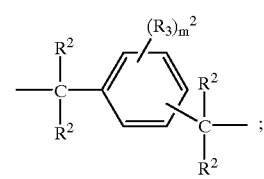
(VII)

wherein the $R^2$s and $R^3$s may be identical or different, each denoting a hydrogen atom, an alkyl group having a carbon number of 1 to 5, a phenyl group, a aralkyl group, an alkoxy group, or a halogen atom, and $m^2$ is an integer from 0 to 4;

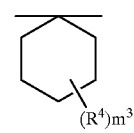
(VIII)

wherein the $R^4$s may be identical or different, each denoting an alkyl group having a carbon number of 1 to 5, a phenyl group, a aralkyl group, an alkoxy group, or a halogen atom, and $m^3$ is an integer from 0 to 6;

(IX)

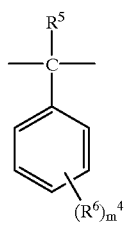

wherein the $R^5$s and $R^6$S may be identical or different, each denoting a hydrogen atom, an alkyl group having a carbon number of 1 to 5, a phenyl group, a aralkyl group, an alkoxy group, or a halogen atom, and $m^4$ is an integer from 0 to 4;

(II)

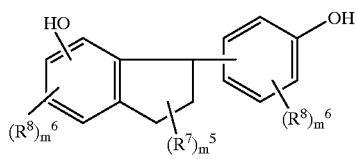

wherein the $R^7$s and $R^8$s may be identical or different, each denoting an alkyl group having a carbon number of 1 to 5, phenyl group a aralkyl group, an alkoxy group, or a halogen atom, and the $m^5$s and $m^6$s may be identical or different, each denoting an integer from 0 to 4;

(III)

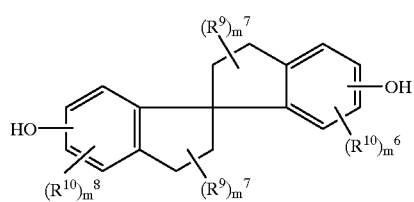

wherein the $R^9$s and $R^{10}$s may be identical or different, each denoting an alkyl group having a carbon number of 1 to 5, a phenyl group, a aralkyl group, an alkoxy group, or a halogen atom, and the $m^7$s and $m^8$s may be identical or different, each denoting an integer from 0 to 4;

(IV)

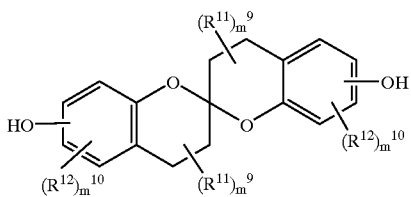

wherein the $R^{11}$s and $R^{12}$s may be identical or different, each denoting an alkyl group having a carbon number of 1 to 5, a phenyl group, a aralkyl group, an alkoxy group, or a halogen atom, and the $m^9$s and $m^{10}$s may be identical or different, each denoting an integer from 0 to 4.

4. The epoxy resin composition of claim 1, which is obtained by reaction of epihalohydrin with a mixture composed of said 4,4'-biphenol and at least one of phenol compounds which yield a noncrystalline epoxy resin having a softening point from 35° C. to 55° C. in the case that the phenol compound alone is epoxidized, in a molar ratio of 3 to 20 mol based on 1 mol of a phenolic hydroxyl group in said mixture composed of said phenol compounds under the presence of an alkaline metal hydroxide.

5. An epoxy resin composition for encapsulating semiconductors which comprises the epoxy resin composition of claim 1, a curing agent for epoxy resins, an inorganic filler, and a curing accelerator.

6. The epoxy resin composition for encapsulating semiconductors of claim 5, wherein said curing agent for epoxy resins is at least one kind of curing agent for epoxy resins selected from a phenol-aralkyl resin, a terpenephenol resin, a dicyclopentadiene phenol resin, and an active ester-modified phenol resin which is obtained by completely or partially esterifying a phenolic hydroxyl group in phenolic compounds.

7. The epoxy resin composition for encapsulating semiconductors of claim 5, wherein said inorganic filler is fused and/or crystalline silica powder containing not less than 30% by weight of spherical components, and which is mixed in 70 to 95% by weight based on the total amount of the composition.

8. The epoxy resin composition for encapsulating semiconductors of claim 5, wherein other epoxy resins except said 4,4'-biphenol containing epoxy resin (a) and said noncrystalline epoxy resin (b) are mixed in a proportion of not more than 100 parts by weight based on total 100 parts by weight of the epoxy resins (a) and (b).

* * * * *